(12) United States Patent
Kim et al.

(10) Patent No.: US 7,271,059 B2
(45) Date of Patent: Sep. 18, 2007

(54) SEMICONDUCTOR DEVICE AND METHOD OF FABRICATING THE SAME

(75) Inventors: Sang-Soo Kim, Suwon-si (KR); Byung-Sun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 160 days.

(21) Appl. No.: 11/048,845

(22) Filed: Feb. 3, 2005

(65) Prior Publication Data

US 2005/0173753 A1 Aug. 11, 2005

(30) Foreign Application Priority Data

Feb. 6, 2004 (KR) .................. 10-2004-0008051

(51) Int. Cl.
*H01L 21/336* (2006.01)
(52) U.S. Cl. .................. 438/257; 438/275
(58) Field of Classification Search .............. 438/257, 438/258, 275, 241
See application file for complete search history.

(56) References Cited

U.S. PATENT DOCUMENTS

| | | | |
|---|---|---|---|
| 5,998,252 A * | 12/1999 | Huang | 438/241 |
| 6,037,222 A * | 3/2000 | Huang et al. | 438/257 |
| 6,274,411 B1 | 8/2001 | Patelmo et al. | |
| 2004/0092070 A1* | 5/2004 | Hsu et al. | 438/241 |
| 2004/0180487 A1* | 9/2004 | Eppich et al. | 438/199 |

FOREIGN PATENT DOCUMENTS

| KR | 1020000023619 A | 4/2000 |
|---|---|---|
| KR | 2003-0063943 | 7/2003 |

* cited by examiner

*Primary Examiner*—Tuan H. Nguyen
(74) *Attorney, Agent, or Firm*—Volentine & Whitt, PLLC (57) ABSTRACT

A method of fabricating a semiconductor device having a non-volatile memory cell includes forming an insulation layer as an uppermost/outermost portion of the memory cell to enhance the charge retention capability of the memory cell. The insulation layer is formed after the gate structure and integrate dielectric of the non-volatile memory cell, and a gate of a logic transistor are formed. The insulation layer thus enhances the function of the intergrate dielectric. Subsequently, a conductive layer is formed on the substrate including over the gate of the logic transistor. A silicide layer is then formed on the gate of the logic transistor and on the substrate adjacent opposite sides of the gate. The insulation layer thus also serves prevent the formation of a silicide layer on the non-volatile memory cell.

19 Claims, 6 Drawing Sheets

SEMICONDUCTOR DEVICE AND METHOD OF FABRICATING THE SAME

BACKGROUND OF THE INVENTION

1. Field of the Invention

The present invention relates to a semiconductor device and to a method of fabricating the same. More specifically, the present invention is directed to a semiconductor device having a non-volatile memory cell and to a method of fabricating the same.

2. Description of the Related Art

Non-volatile memory cells continuously hold their stored data even when their power supplies are interrupted. Typically, a non-volatile memory cell has a gate stack structure. Specifically, a non-volatile memory cell has a gate stack and a source/drain formed at opposite sides of the gate stack. The gate stack includes a gate insulation layer, a floating gate, an intergate dielectric, and a control gate which are sequentially stacked on a substrate. Charges are introduced to the floating gate through a tunnel insulation layer to be stored therein. The stored charges set a threshold voltage of the cell. A non-volatile memory cell stores data using the cell threshold voltage.

The fabricating of a non-volatile memory device includes a photolithographic process following the formation of the intergate dielectric. Specifically, the photolithographic process is carried out to form the control gate on the intergate dielectric. In this case, the intergate dielectric may be damaged during the photolithographic process. Also, the intergate dielectric may be additionally damaged during a subsequent process in which a spacer is formed. Damage to the intergate dielectric degrades the reliability of the non-volatile memory device because if charges stored in the floating gate migrate through the damaged intergate dielectric during operation of the cell, the threshold voltage of the cell fluctuates. Hence, the data stored in the cell is altered.

Also, it might be desirable to produce a semiconductor device in which a logic transistor is integrated with the non-volatile memory cell. Conventionally, logic transistors may include a silicide layer to enhance the operating speed thereof. However, a silicide layer can not withstand the high program voltage of a non-volatile memory cell.

SUMMARY OF THE INVENTION

An object of the present invention is to provide a semiconductor device that includes a highly reliable non-volatile memory cell.

Another object of the present invention is to provide a semiconductor device that includes both a non-volatile memory cell and a logic transistor which can operate at a high speed.

According to one aspect of the present invention, a method of fabricating a semiconductor device includes (a) preparing a substrate including a first area where a logic transistor is to be formed and a second area where a non-volatile memory cell is to be formed, and (b) forming a logic transistor and a non-volatile memory cell at the first and second areas, respectively. In this respect, an insulation layer is formed as an outermost portion of the non-volatile memory cell to enhance the charge retention capability of the cell, and a silicide layer is formed at the first area of the substrate.

The non-volatile memory cell and the logic transistor may be formed by forming a first gate insulation layer and a second gate insulation on the first and second areas of the substrate, respectively, forming a first (floating) gate and an intergate dielectric on the first gate insulation layer, and forming a second gate on the first gate insulation layer and a second (control) gate on the intergate dielectric. The silicide layer is formed on the substrate adjacent opposite sides of the gate formed at the first area of the substrate and on the gate itself at the first area. The insulation layer covers the gate structure and the substrate at the second area to prevent the formation of a silicide layer at the second area and to enhance the function of the intergate dielectric.

The silicide layer may be formed by forming a metal layer over the entire surface of the substrate and performing a silicide heat-treating process. A silicide layer is not formed at the second area, i.e., the area where the non-volatile memory cell is formed, because the insulation layer covers the second area. On the other hand, the gate at the first area, and the silicon exposed adjacent opposite sides of the gate, react with the metal layer to form a silicide layer at the first area, i.e., the area where the logic transistor is formed.

According to another aspect of the present invention, an I/O transistor is formed at a third area of the substrate. In this case, the gate insulation layer is also formed at the third area of the substrate, and a gate of the I/O transistor is formed on the third area of the substrate. Preferably, the gate of the I/O transistor is formed at the time the gate of the logic transistor is formed on the second area of the substrate, and the (control) gate of the non-volatile memory cell is formed on the intergate dielectric at the third area of the substrate. In this case, the insulation layer is formed over the second and third areas of the substrate.

According to yet another aspect of the present invention, the present invention provides a semiconductor device including a first gate formed on a gate insulation at an upper portion of a substrate, an intergate dielectric disposed on the first gate, a second gate overlying only a portion of the intergate dielectric such that another portion of the first gate is left exposed by the second gate, and an insulation layer extending over at least that portion of the intergate dielectric left exposed by the second gate. Accordingly, the insulation layer protects the intergate dielectric and enhances the function thereof.

According to another aspect of the present invention, the insulation layer may include an oxide or silicon oxynitride. Preferably, the enhancing insulation layer is a multi-layered film including both an oxide and a nitride. For example, the enhancing insulation layer may be an oxide-silicon oxynitride-silicon nitride film, a silicon-silicon oxynitride-oxide film, an oxide-silicon nitride-silicon oxynitride-silicon nitride film, or an oxide-silicon nitride-oxide film. The aforementioned materials appear stacked in the films in the order named.

DETAILED DESCRIPTION OF THE PREFERRED EMBODIMENTS

The preferred embodiments of the present invention will be described in more detail with reference to the accompanying drawings. In the drawings, the thickness of layers and regions are exaggerated for clarity. Also, like numbers designate like elements throughout the drawings. Still further, when a layer is referred to as being "on" or "over" another layer or substrate, such a description may refer to either the layer in question being disposed directly on the other layer or substrate or may refer to intervening layers being present therebetween.

Figure 1:
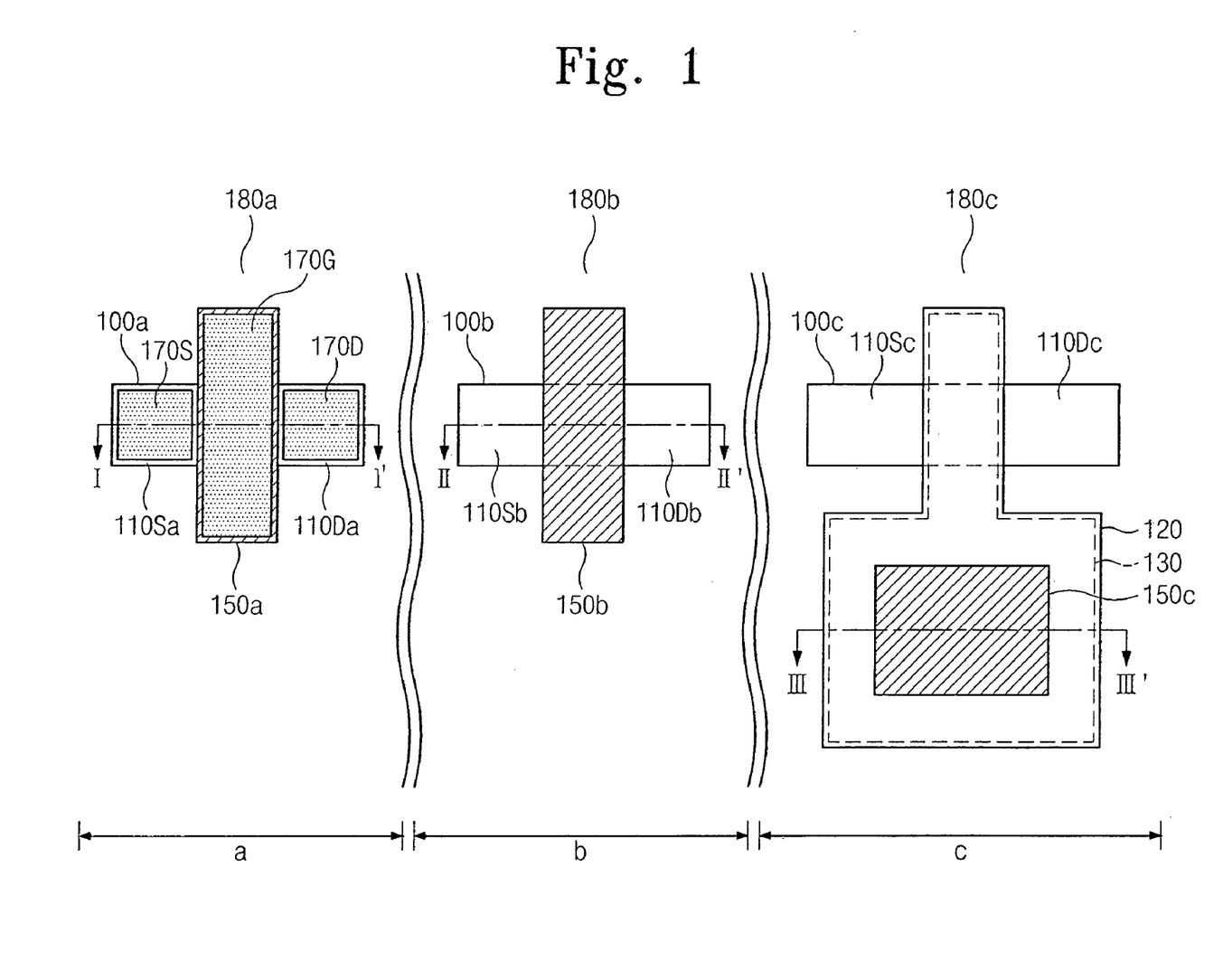
FIG. 1 is a plan view of a semiconductor device according to the present invention.

Referring to FIG. 1, a semiconductor device according to the present invention includes a logic transistor 180a, an input/output transistor (hereinafter referred to as "I/O transistor") 180b, and a non-volatile memory cell 180c. In FIG. 1, characters 'a', 'b', and 'c' denote a logic transistor forming area in which the logic transistor is formed, an input/output transistor forming area (hereinafter referred to as "I/O transistor forming area") in which the I/O transistor is formed, and a memory cell forming area in which the non-volatile memory cell is formed, respectively.

Also, in FIG. 1, reference numerals 100a-100c denote active regions, reference numeral 120 denotes a floating gate of the non-volatile memory cell 180c, reference numeral 130 denotes an intergate dielectric of the non-volatile memory cell 180c, reference numeral 150c denotes a control gate of the non-volatile memory cell 180c, reference numeral 150a denotes a gate of the logic transistor 180a, reference numeral 150b denotes a gate of the I/O transistor 180b, and reference numerals 110Sa-110Sc and 110Da-110Dc denote source/drain regions formed at opposite sides (active regions) of the gates 150a, 150b and 120. Although not shown in this figure, a gate insulation layer is disposed between the gates 150a, 150b, 120 and a substrate.

The logic transistor 180a also has silicide layers 170S/170D and 170G on the source/drain region 110Sa/100Da and the gate 150a. The control gate 150c of the non-volatile memory cell 180c is smaller than the floating gate 120 so as to provide a high coupling ratio and margin for the photolithographic process used to produce the gates. The control gate 150c overlies the floating gate 120 outside the active region 100c. Also, the non-volatile memory cell 180c includes an insulation layer for enhancing the charge retention of the intergate dielectric 130 (not shown in this figure). The insulation layer is formed at least on that part of the intergate dielectric 130 which is exposed by the control gate 150c.

A method of fabricating the semiconductor device shown in FIG. 1 will now be described with reference to FIG. 2 through FIG. 7.

Figure 2:
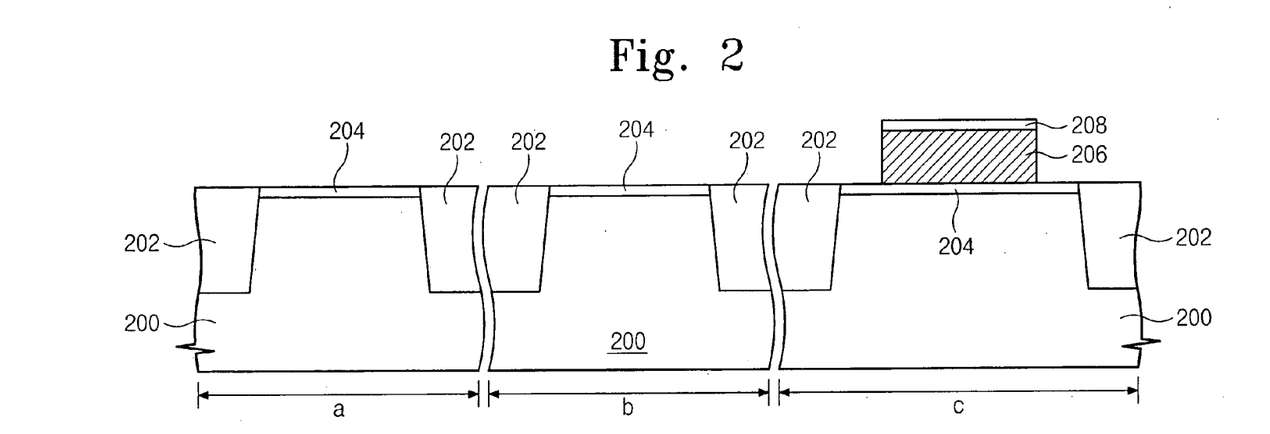
FIG. 2 through FIG. 7 are cross-sectional views of a substrate, corresponding to cross-sectional views taken along lines I-I', II-II', and III-III' in FIG. 1, and illustrating a method of fabricating a semiconductor device according to the present invention.

As illustrated in FIG. 2, a substrate 200, which includes a logic transistor forming area 'a', an I/O transistor forming area 'b', and a non-volatile memory cell forming area 'c', is prepared. Next, a conventional device isolation process is carried out to form a device isolation layer 202. Regions surrounded by the device isolation layer 202 become the active regions. Gate insulation layers 204 are formed on the substrate 200 in the active regions using conventional techniques. The gate insulation layers 204 have thicknesses that are suited to the characteristics required of the device. A floating gate 206 and an intergate dielectric 208 are sequentially formed on the gate insulation layer 204 at the memory cell forming area 'c'. Specifically, a gate layer made of, for example, polysilicon, and then a multi-layered film are formed over the entire surface of the substrate. The multi-layered film is an oxide-nitride-oxide (ONO) film. The multi-layered film and gate layer are then patterned using a photolithographic process to form the gate 206 and intergate dielectric 208 at the memory cell forming area 'c'. Subsequently, an ion implanting process is carried out to form an impurity diffusion region, e.g., source/drain regions, at opposite sides of the floating gate 206.

Figure 3:
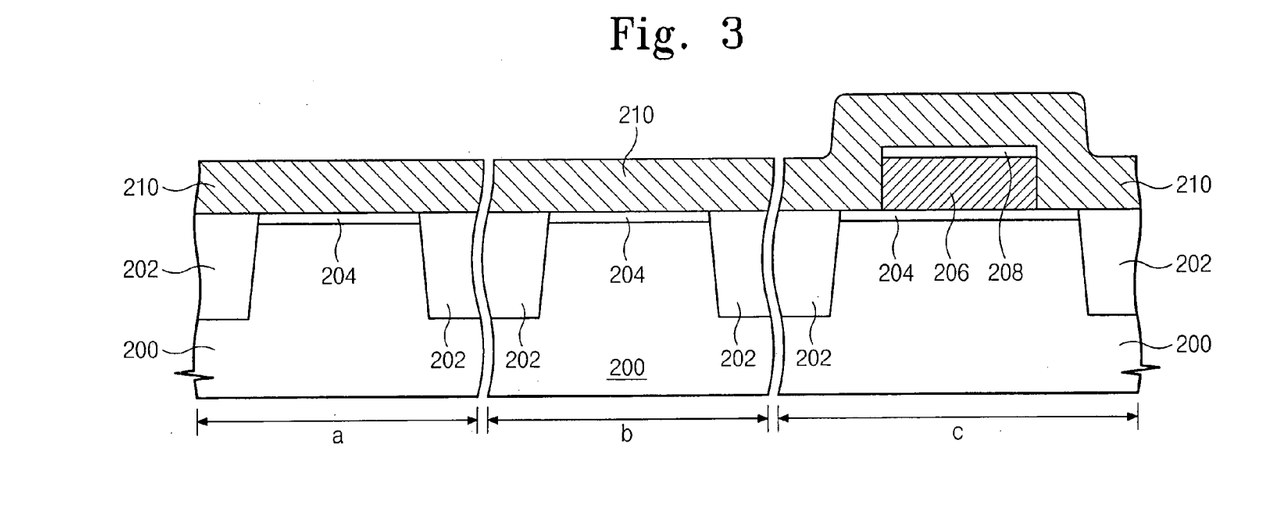

As illustrated in FIG. 3, a second gate layer 210 is formed over the entire surface of the substrate 200. The second gate layer 210 is made of, for example, polysilicon.

Figure 4:
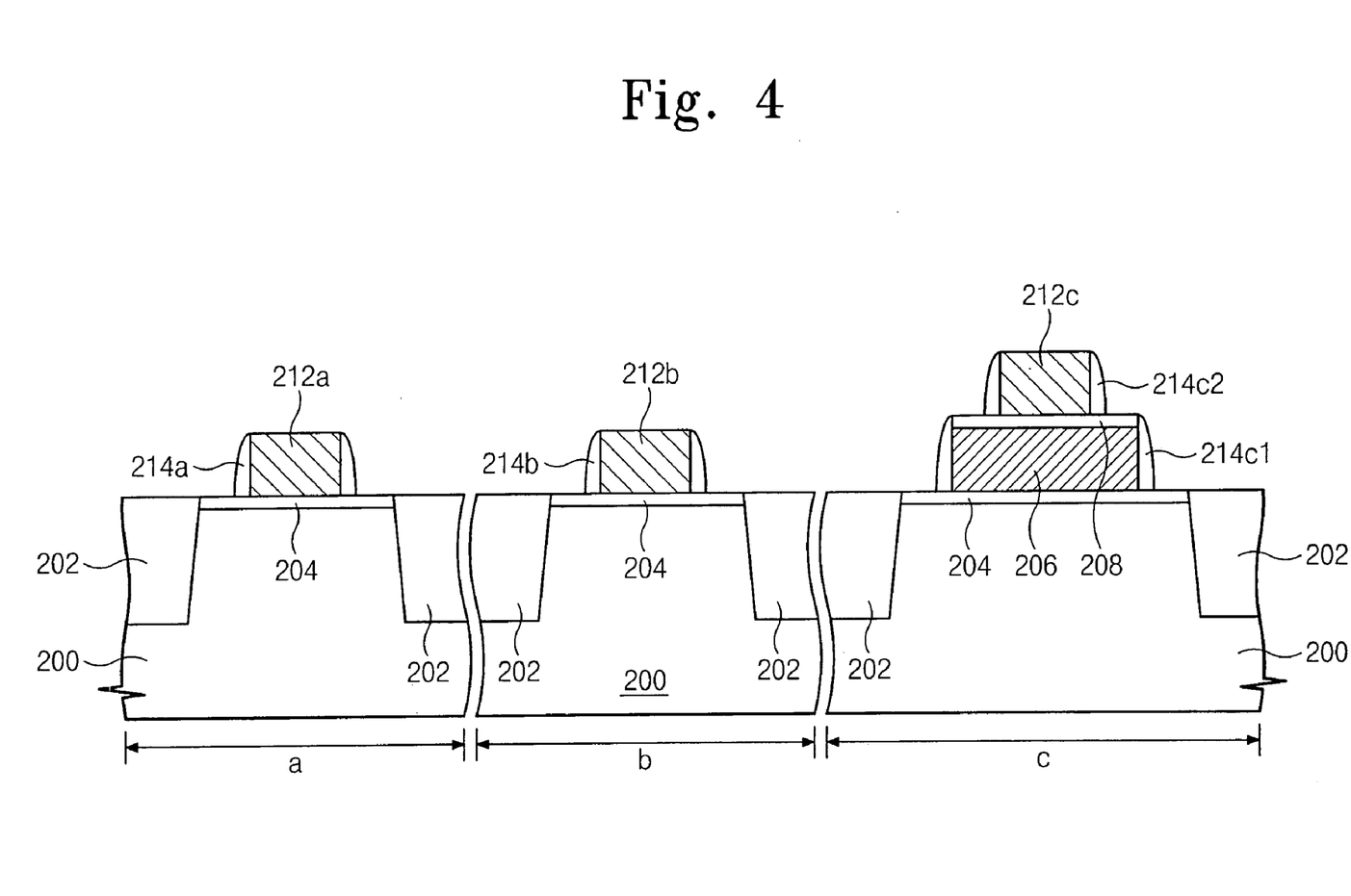

As illustrated in FIG. 4, a photolithographic process is carried out to form a logic gate 212a, an I/O gate 212b, and a control gate 212c at the logic transistor forming area 'a', I/O transistor forming area 'b', and memory cell forming area 'c', respectively. The control gate 212c is smaller than the floating gate 206. An ion implanting process is carried out to form impurity diffusion regions at opposite sides of the logic gate 212a in the logic transistor forming area 'a', and at opposite sides of the I/O gate 212b in the I/O transistor forming area 'b'. The memory cell area 'c' is covered with a mask during this process.

Next, a spacer insulation layer is formed over the entire surface of the substrate 200. An etch-back process is then carried out to form spacers 214a and 214b on sidewalls of the logic gate 212a and I/O gate 212b, and to form spacers 214c1 and 214c2 on sidewalls of the floating gate 206 and control gate 212c. The sidewall spacers may be made of, for example, a nitride or oxide. Although an upper oxide layer of the integrate dielectric 208 is etched, the insulation layer mitigates the etching of the oxide, as will be described later.

Figure 5:
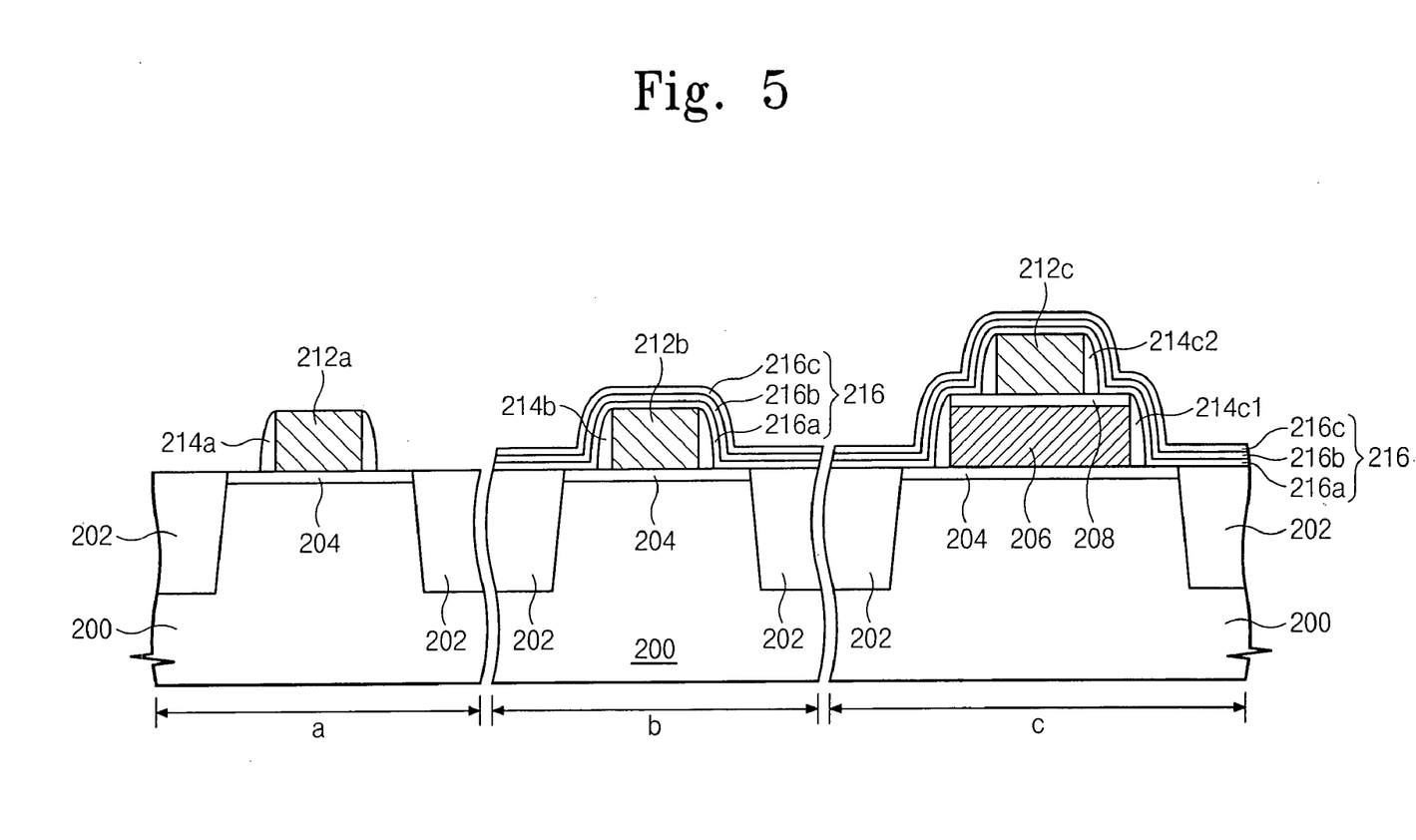

As illustrated in FIG. 5, an insulation layer 216 is formed on the substrate 200 over the I/O transistor forming area 'b' and the memory cell forming area 'c'. More specifically, an insulation layer is first formed over the entire surface of the substrate 200, and then a photolithographic process is carried out to remove the insulation layer from the logic transistor forming area 'a' while leaving the remainder of the insulation layer in the I/O transistor forming area 'b' and the memory cell forming area 'c'.

The insulation layer 216 comprises an oxide or a nitride. Also, the insulation layer 216 may be a multi-layered film comprising, for example, oxide 216a, oxynitride 216b, and oxide 216 layers that are stacked in the foregoing order. Alternatively, the insulating layer 216 may be a multi-layered film comprising oxide-silicon nitride-silicon oxynitride-silicon nitride and oxide-silicon nitride-oxide layers that are stacked in the foregoing order. In the case in which the insulation layer 214 is a multi-layered film, its lowest layer preferably comprises an oxide.

Figure 6:
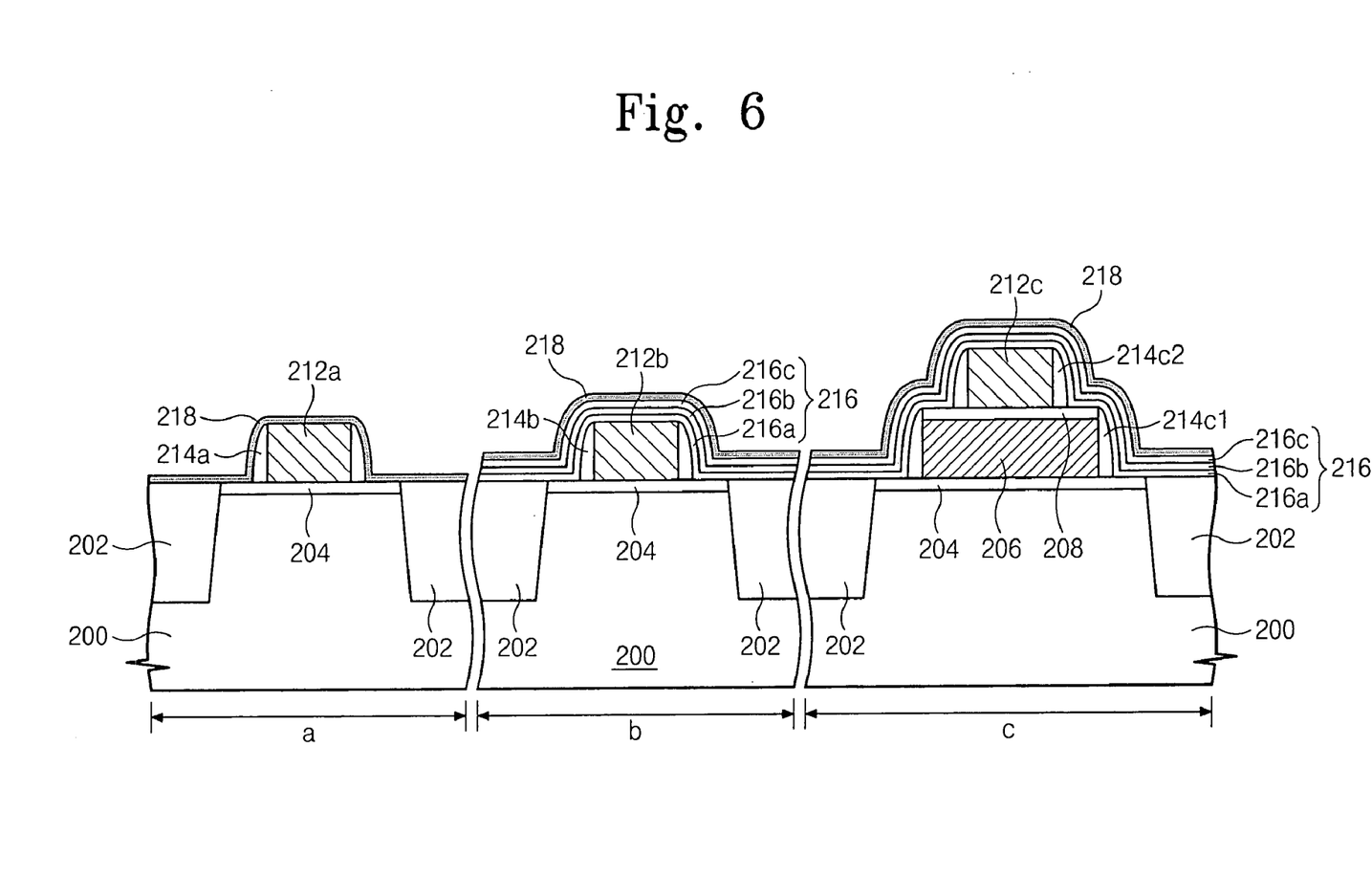

As illustrated in FIG. 6, a metal layer 218 is formed over the entire surface of the substrate 200. The metal layer 218 may be of a material which can react with silicon to form a silicide, i.e., a material having a low resistivity. The metal layer 216 may comprise a material having a high fusion point such as cobalt, nickel, or titanium. The metal layer 218 does not contact the substrate 200 or gates at the I/O transistor forming area 'b' and the memory cell forming area 'c' because the areas 'b' and 'c' are covered with the insulation layer 216.

Figure 7:
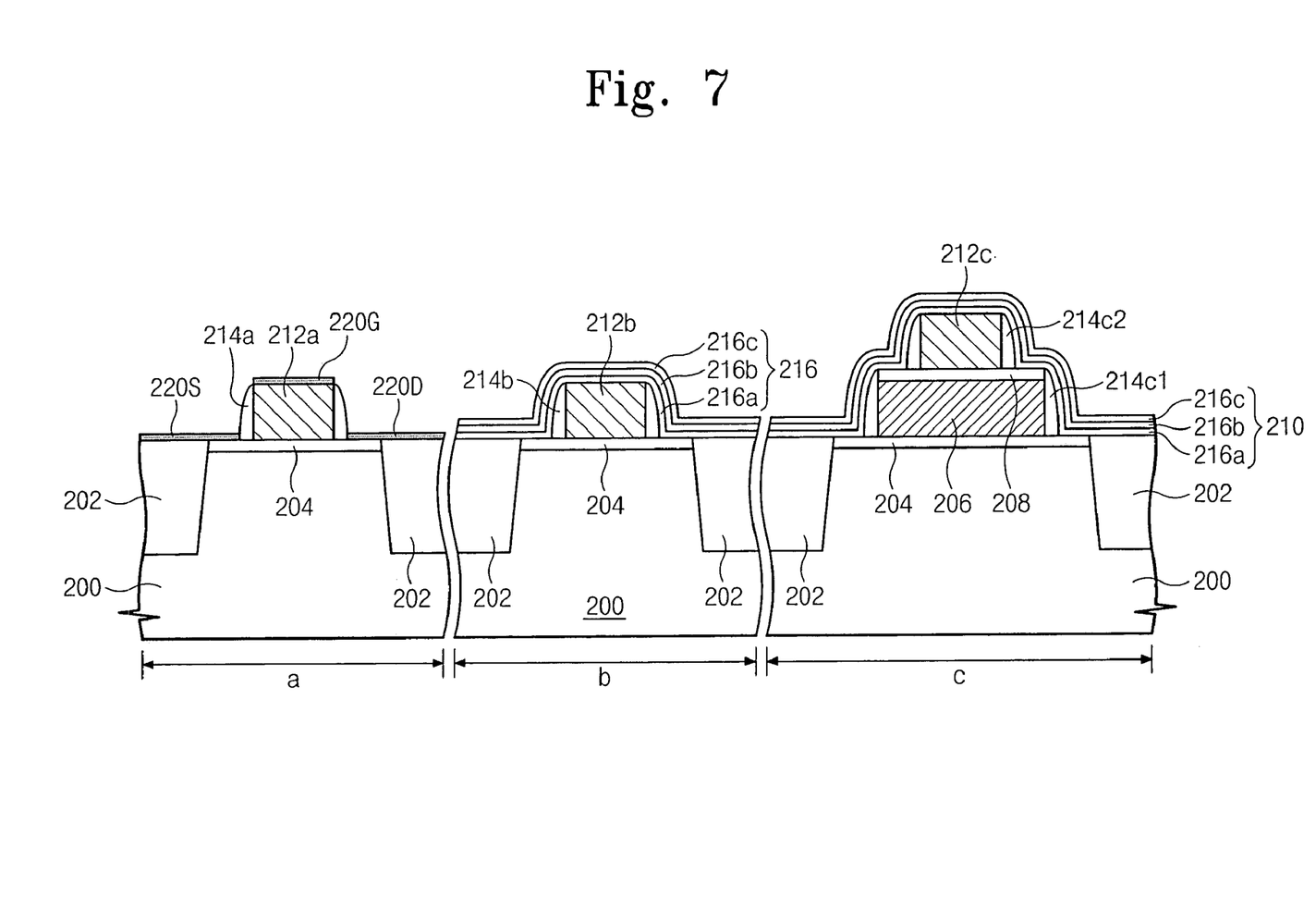

As illustrated in FIG. 7, a silicide heat-treating process is carried out to form silicide layers 220S, 220D, and 220G at the logic transistor forming area 'a'. That is, a silicide layer is selectively formed on an impurity diffusion region and a gate. Subsequently, the non-reacted metal layer is removed from the I/O transistor forming area 'b' and the memory cell forming area 'c'.

According to the present invention as described above, an insulation layer enhances the charge retention capability of the memory cell. Furthermore, a silicide layer is selectively formed at the logic transistor to enhance the operating speed of the logic transistor. Such a silicide layer, though, is not durable to the high program voltage of a non-volatile memory cell. However, according to the present invention, the insulation layer prevents the forming of a silicide layer on the control gate of the memory cell. Therefore, a highly integrated semiconductor device having a reliable memory cell can be fabricated by performing a relatively simple process.

Finally, although the present invention been described above with reference to the preferred embodiments thereof, it is to be understood that the present invention is not limited to those precise embodiments. Rather, various changes and modifications may be made to those embodiments by one of ordinary skill in the art without departing from the true scope or spirit of the invention as defined by the appended claims.

What is claimed is:

1. A method of fabricating a semiconductor device, comprising:
    preparing a substrate including a first area where a logic transistor is to be formed and a second area where a non-volatile memory cell is to be formed;
    forming a non-volatile memory cell at the second area of the substrate, comprising forming a floating gate on the second area of the substrate, forming an integrate dielectric on the floating gate, forming a control gate on the intergate dielectric and which has a smaller surface area than each of the floating gate and the intergate dielectric such that an upper part of the intergate dielectric is exposed, and forming an insulation layer as an uppermost portion of the non-volatile memory cell and in contact with the upper part of the intergate dielectric exposed by the control gate to thereby enhance the charge retention capability of the memory cell; and
    forming a logic transistor at the first area of the substrate, comprising selectively forming a silicide layer at the first area.

2. The method as recited in claim 1, wherein said forming of the insulation layer comprises forming a layer comprising an oxide as the uppermost portion of the non-volatile memory cell.

3. The method as recited in claim 1, wherein said forming of the insulation layer comprises forming a layer comprising silicon oxynitride as the uppermost portion of the non-volatile memory cell.

4. The method as recited in claim 1, wherein said forming of the insulation layer comprises forming a multi-layered film comprising an oxide and a nitride as the uppermost portion of the non-volatile memory cell.

5. The method as recited in claim 1, wherein said forming of the insulation layer comprises forming a multi-layered film selected from the group consisting of an oxide-silicon oxynitride-silicon nitride film, a silicon-silicon oxynitride-oxide film, an oxide-silicon nitride-silicon oxynitride-silicon nitride film, and an oxide-silicon nitride-oxide film as the uppermost portion of the non-volatile memory cell.

6. The method as recited in claim 5, wherein said forming a non-volatile memory cell at the second area of the substrate and said forming a logic transistor at the first area of the substrate comprise:
    forming a gate insulation layer on the first and second areas of the substrate, forming a first gate pattern and an intergate dielectric pattern on the gate insulation layer to thereby form the floating gate and the intergate dielectric at the second area of the substrate, and subsequently forming a second gate pattern on the gate insulation layer to thereby form a logic gate at said first area and the control gate on the intergate dielectric, and forming the silicide layer on the logic gate and on the first area of the substrate adjacent opposite sides of the logic gate.

7. The method as recited in claim 6, wherein said forming of the insulation layer comprises forming the insulation layer over the second area of the substrate including over the control gate before the silicide layer is formed on the first area of the substrate.

8. The method as recited in claim 6, wherein said forming of the second gate pattern comprises forming a second gate layer on the substrate, and subsequently patterning the second gate layer to leave on the integrate dielectric a portion of the gate layer having a smaller surface area than each of the floating gate and the integrate dielectric.

9. The method as recited in claim 1, wherein:
    said preparing a substrate comprises preparing the substrate to further include a third area where an input/output transistor (I/O) transistor is to be formed, and
    further comprising forming, at the third area of the substrate, an I/O transistor in which the insulation layer is an uppermost portion thereof.

10. The method as recited in claim 9, wherein said forming the logic transistor, the I/O transistor, and the non-volatile memory cell at the first, second, and third areas of the substrate comprise:
    forming a gate insulation layer on the first, second, and third areas of the substrate, forming a first gate pattern and an intergate dielectric pattern on the gate insulation layer to thereby form the floating gate and the intergate dielectric at the second area of the substrate, and subsequently forming a second gate pattern on the gate insulation layer to thereby form a logic gate at said first area, the control gate on the intergate dielectric, and an I/O gate at said third area.

11. The method as recited in claim 10, wherein said forming of the insulation layer comprises forming a layer comprising an oxide as the uppermost portions of the non-volatile memory cell and I/O transistor.

12. The method as recited in claim 10, wherein said forming of the insulation layer comprises forming a layer comprising silicon oxynitride as the uppermost portions of the non-volatile memory cell and I/O transistor.

13. The method as recited in claim 10, wherein said forming of the insulation layer comprises forming a multi-layered film comprising an oxide and a nitride as the uppermost portions of the non-volatile memory cell and I/O transistor.

14. The method as recited in claim 10, wherein said forming of the insulation layer comprises forming a multi-layered film selected from the group consisting of an oxide-silicon oxynitride-silicon nitride film, a silicon-silicon oxynitride-oxide film, an oxide-silicon nitride-silicon oxynitride-silicon nitride film, and an oxide-silicon nitride-oxide film as the uppermost portions of the non-volatile memory cell and I/O transistor.

15. The method as recited in claim 10, wherein said forming of the insulation layer comprises forming the insulation layer over the second and third areas of the substrate including over the control gate before the silicide layer is formed on the first area of the substrate.

16. A method of fabricating a semiconductor device, comprising:
    preparing a substrate including a first area where a logic transistor is to be formed, a second area where a non-volatile memory cell is to be formed, and a third area where an input/output transistor (I/O transistor) is to be formed;

forming a gate insulation layer on the first, second, and third areas of the substrate;

forming a first gate pattern and an intergate dielectric pattern on the gate insulation layer to thereby form a first gate and an intergate dielectric on the second area of the substrate;

forming a respective gate on the gate insulation layer at the first area of the substrate, on the intergate dielectric pattern, and on the gate insulation layer at the third area of the substrate, such that the respective gate formed on intergate dielectric pattern has a smaller surface area than each of the first gate and the intergate dielectric so as to expose an upper part of the intergate dielectric;

forming an insulation layer over the respective gates formed at the second and third areas of the substrate and in contact with the upper part of the intergate dielectric exposed by the respective gate formed thereon, whereby a non-volatile cell is formed at the second area of the substrate, the insulation layer constituting an uppermost portion of the non-volatile memory cell; and selectively forming a silicide layer on the respective gate formed at the first area of the substrate and on the substrate adjacent opposite sides of the gate formed at the first area.

17. The method as recited in claim 16, wherein said forming of the insulation layer comprises forming a multi-layered film selected from the group consisting of an oxide-silicon oxynitride-silicon nitride film, a silicon-silicon oxynitride-oxide film, an oxide-silicon nitride-silicon oxynitride-silicon nitride film, and an oxide-silicon nitride-oxide film as the uppermost portion of the non-volatile memory cell.

18. The method as recited in claim 16, and further comprising forming insulation spacers on sidewalls of the respective gates formed at the first area of the substrate, on the intergate dielectric pattern, and at the third area of the substrate and on sidewalls of the first gate, all before the insulation layer is formed.

19. The method as recited in claim 16, wherein said forming of the respective gate comprises forming a second gate layer on the substrate, and subsequently patterning the second gate layer to leave on the intergate dielectric a portion of the second gate layer having a smaller surface area than each of the first gate on the second area of the substrate and the intergate dielectric.

* * * * *